United States Patent
Hoshino

(10) Patent No.: US 11,215,925 B2
(45) Date of Patent: Jan. 4, 2022

(54) METHOD OF FORMING RESIST PATTERN

(71) Applicant: ZEON CORPORATION, Tokyo (JP)

(72) Inventor: Manabu Hoshino, Tokyo (JP)

(73) Assignee: ZEON CORPORATION, Tokyo (JP)

(*) Notice: Subject to any disclaimer, the term of this patent is extended or adjusted under 35 U.S.C. 154(b) by 30 days.

(21) Appl. No.: 16/963,504

(22) PCT Filed: Jan. 21, 2019

(86) PCT No.: PCT/JP2019/001698
§ 371 (c)(1),
(2) Date: Jul. 21, 2020

(87) PCT Pub. No.: WO2019/151021
PCT Pub. Date: Aug. 8, 2019

(65) Prior Publication Data
US 2021/0072643 A1 Mar. 11, 2021

(30) Foreign Application Priority Data
Feb. 5, 2018 (JP) .............................. JP2018-018438

(51) Int. Cl.
| G03F 7/40 | (2006.01) |
| G03F 7/039 | (2006.01) |
| C08F 212/08 | (2006.01) |
| G03F 7/16 | (2006.01) |
| G03F 7/32 | (2006.01) |

(52) U.S. Cl.
CPC ............ *G03F 7/039* (2013.01); *C08F 212/08* (2013.01); *G03F 7/162* (2013.01); *G03F 7/168* (2013.01); *G03F 7/322* (2013.01); *G03F 7/325* (2013.01); *G03F 7/40* (2013.01)

(58) Field of Classification Search
CPC .......... G03F 7/039; G03F 7/168; G03F 7/325; G03F 7/40
USPC .................................................. 430/326, 331
See application file for complete search history.

(56) References Cited

U.S. PATENT DOCUMENTS

| 2004/0072108 A1* | 4/2004 | Hyon .................. H01L 21/0273 430/331 |
| 2011/0159252 A1* | 6/2011 | Ober ........................ G03F 7/30 428/195.1 |
| 2019/0004425 A1 | 1/2019 | Hoshino |
| 2019/0056664 A1 | 2/2019 | Hoshino |

FOREIGN PATENT DOCUMENTS

| EP | 3564276 A1 | 11/2019 |
| JP | 2019015860 A | 1/2019 |
| WO | WO 2017/002497 A1 * | 1/2017 |
| WO | 2017130870 A1 | 8/2017 |
| WO | 2017130872 A1 | 8/2017 |
| WO | 2018123667 A1 | 7/2018 |

OTHER PUBLICATIONS

Computer-generated translation of WO 2017/002497 (Year: 2017).*
Aug. 11, 2020, International Preliminary Report on Patentability issued in the International Patent Application No. PCT/JP2019/001698.
Mar. 12, 2019, International Search Report issued in the International Patent Application No. PCT/JP2019/001698.
Sep. 24, 2021, the Extended European Search Report issued by the European Patent Office in the corresponding European Patent Application No. 19748368.8.

* cited by examiner

*Primary Examiner* — John A McPherson
(74) *Attorney, Agent, or Firm* — Kenja IP Law PC

(57) ABSTRACT

A method of forming a resist pattern includes: a step of forming a resist film using a positive resist composition containing a solvent and a polymer including monomer units represented by the following formulae (I) and (II), respectively; an exposure step; a development step; and a step of rinsing the developed resist film using a rinsing liquid having a surface tension of 20.0 mN/m or less. In formula (I), $R^1$ is an organic group including 3 to 7 fluorine atoms. In formula (II), $R^2$ is a hydrogen atom, a fluorine atom, or an unsubstituted or fluorine atom-substituted alkyl group, $R^3$ is a hydrogen atom or an unsubstituted or fluorine atom-substituted alkyl group, p and q are each an integer of 0 to 5, and p+q=5.

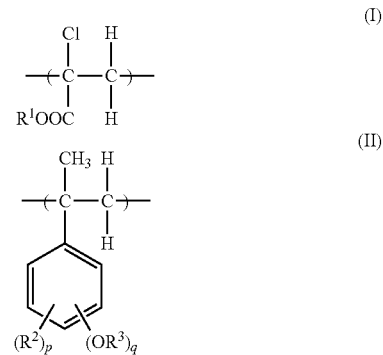

5 Claims, No Drawings

METHOD OF FORMING RESIST PATTERN

TECHNICAL FIELD

The present disclosure relates to a method of forming a resist pattern and, in particular, to a method of forming a resist pattern using a positive resist composition containing a polymer that can suitably be used as a positive resist.

BACKGROUND

Polymers that display increased solubility in a developer after undergoing main chain scission through irradiation with ionizing radiation, such as an electron beam or extreme ultraviolet light (EUV), or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

Patent Literature (PTL) 1, for example, discloses a method of forming a resist pattern that includes using a developer having a surface tension of 17.0 mN/m or less to develop a resist film formed using a main chain scission-type positive resist composition that contains a polymer including one or more fluorine atoms. Through this method of forming a resist pattern, it is possible to inhibit the collapse of a resist pattern.

CITATION LIST

Patent Literature

PTL 1: WO2017/130872A1

SUMMARY (Technical Problem)

In recent years, there has been demand for further increasing the clarity of resist patterns. However, a resist pattern obtained by the method of forming a resist pattern in accordance with PTL 1 leaves room for further improvement in terms of clarity. Studies carried out by the inventor have revealed that besides "resist pattern collapse", "presence of residues in a resist pattern" also acts as a cause of loss of clarity of a resist pattern.

Accordingly, an object of the present disclosure is to well inhibit the occurrence of collapse and the presence of residues in a resist pattern in order to further improve the clarity of the obtained resist pattern.

(Solution to Problem)

The inventor conducted diligent studies with the aim of solving the problem set forth above. The inventor discovered that a rinsing step performed after a development step makes a large contribution to reducing resist pattern collapse and the presence of residues in a resist pattern. More specifically, the inventor made a new discovery that the occurrence of collapse and the presence of residues in a resist pattern can be effectively inhibited by, in formation of a main chain scission-type positive resist using a positive resist composition that contains a specific polymer including one or more fluorine atoms, performing rinsing using a rinsing liquid that satisfies a specific property. In this manner, the inventor completed the present disclosure.

Specifically, the present disclosure aims to advantageously solve the problem set forth above, and a presently disclosed method of forming a resist pattern comprises: forming a resist pattern using a positive resist composition containing a solvent and a polymer including a monomer unit (A) represented by general formula (I), shown below,

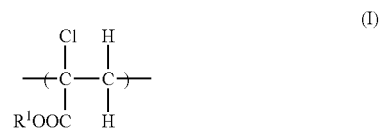

where, in general formula (I), $R^1$ is an organic group including not fewer than 3 and not more than 7 fluorine atoms, and a monomer unit (B) represented by general formula (II), shown below,

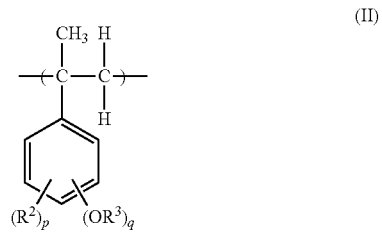

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5; exposing the resist film; developing the resist film that has been exposed; and rinsing the resist film that has been developed, wherein the rinsing is performed using a rinsing liquid having a surface tension of 20.0 mN/m or less.

By using a rinsing liquid having a surface tension of 20.0 mN/m or less to rinse a resist film formed using a positive resist composition that contains a polymer including the specific monomer units (A) and (B) set forth above, it is possible to effectively inhibit the occurrence of collapse and the presence of residues in a resist pattern.

Note that in a case in which p in general formula (II) is 2 or more, each $R^2$ may be the same or different, and in a case in which q in general formula (II) is 2 or more, each $R^3$ may be the same or different. Moreover, the surface tension of a rinsing liquid referred to in the present disclosure can be measured by the ring method at 25° C., for example.

In the presently disclosed method of forming a resist pattern, a total number of fluorine atoms included in the monomer unit (A) and the monomer unit (B) is preferably 5 or 6. When the total number of fluorine atoms included in the monomer unit (A) and the monomer unit (B) is 5 or 6, sensitivity in the method of forming a resist pattern can be increased because the sensitivity of the resist film increases.

In the presently disclosed method of forming a resist pattern, the rinsing liquid preferably has a solubility parameter of less than 6.8. The clarity of an obtained resist pattern can be further increased by performing the rinsing using a rinsing liquid that has a solubility parameter of less than 6.8 $(cal/cm^3)^{1/2}$. Note that the solubility parameter (hereinafter, also referred to as the "SP value") of a rinsing liquid can be calculated by the group contribution method of Hoy.

In the presently disclosed method of forming a resist pattern, the developing is preferably performed using a developer having a surface tension of 17.0 mN/m or less. By using a developer having a surface tension of 17.0 mN/m or less to perform the developing, it is possible to cause good dissolution of a part having increased solubility in the developer as a result of exposure, and thus to further increase the clarity of a resist pattern that is ultimately obtained.

In the presently disclosed method of forming a resist pattern, the developer and the rinsing liquid preferably each comprise a different fluorine-containing solvent relative to one another. By using fluorine-containing solvents for the developer and the rinsing liquid, resist pattern collapse can be more effectively inhibited, and the clarity of an obtained resist pattern can be further improved.

(Advantageous Effect)

Through the presently disclosed method of forming a resist pattern, the occurrence of collapse and the presence of residues in a resist pattern can be effectively inhibited.

DETAILED DESCRIPTION

The following provides a detailed description of embodiments of the present disclosure.

A polymer contained in a resist composition used in the presently disclosed method of forming a resist pattern is a polymer that can be well used as a main chain scission-type positive resist that undergoes main chain scission to lower molecular weight upon irradiation with ionizing radiation, such as an electron beam or extreme ultraviolet light (EUV), or short-wavelength light, such as ultraviolet light. The presently disclosed method of forming a resist pattern is a method that includes a step of rinsing a specific positive resist film using a rinsing liquid satisfying a specific property, and may suitably be adopted for formation of a resist pattern in a production process of a printed board such as a build-up board.

(Method of Forming Resist Pattern)

The presently disclosed method of forming a resist pattern uses a positive resist composition that is described in detail below. Specifically, the presently disclosed method of forming a resist pattern includes a step of forming a resist film using a specific positive resist composition containing a specific polymer including fluorine atoms (resist film formation step), a step of exposing the resist film (exposure step), a step of developing the resist film that has been exposed (development step), and a step of rinsing the resist film that has been developed (rinsing step). A feature of the presently disclosed method of forming a resist pattern is that the rinsing step is performed using a rinsing liquid having a surface tension of 20.0 mN/m or less. The presently disclosed method of forming a resist pattern can sufficiently inhibit resist pattern collapse while also well inhibiting the presence of residues in a resist pattern as a result of a resist film that contains the specific polymer including fluorine atoms being rinsed using a rinsing liquid having a surface tension of 20.0 mN/m or less after the resist film has been developed.

<Resist Film Formation Step>

In the resist film formation step, the positive resist composition is applied onto a workpiece, such as a substrate, that is to be processed using a resist pattern, and the applied positive resist composition is dried to form a resist film. The substrate is not specifically limited and may, for example, be a mask blank including a light shielding layer on a substrate or a substrate including an electrically insulating layer and copper foil on the electrically insulating layer that is used in production of a printed board or the like.

Moreover, no specific limitations are placed on the application method and the drying method of the positive resist composition, and any method that is typically used in formation of a resist film can be adopted. The following positive resist composition is used in the presently disclosed method of forming a pattern.

[Positive Resist Composition]

The positive resist composition contains a solvent and a specific fluorine atom-containing polymer (described in detail below), and may optionally further contain known additives that can be used in resist compositions.

—Polymer—

The polymer contained in the positive resist composition that is used in the presently disclosed method of forming a resist pattern includes:

a monomer unit (A) represented by general formula (I), shown below,

where, in general formula (I), $R^1$ is an organic group including not fewer than 3 and not more than 7 fluorine atoms; and a monomer unit (B) represented by general formula (II), shown below,

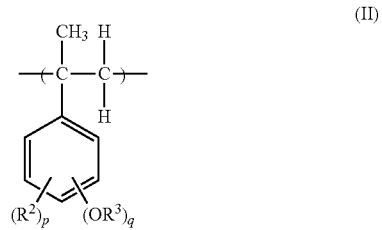

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5. The total number of fluorine atoms included in the monomer unit (A) and the monomer unit (B) is preferably 5 or 6. In this case, sensitivity in the method of forming a resist pattern can be increased because sensitivity of the resist film increases.

Note that although the polymer may also include any monomer units other than the monomer unit (A) and the monomer unit (B), the proportion constituted by the monomer unit (A) and the monomer unit (B) among all monomer units of the polymer is, in total, preferably 90 mol % or more, and is preferably 100 mol % (i.e., the polymer preferably only includes the monomer unit (A) and the monomer unit (B)).

Although the polymer may be a random polymer, a block polymer, an alternating polymer (ABAB . . . ), or the like, for example, without any specific limitations so long as it includes the monomer unit (A) and the monomer unit (B), a polymer including 90 mass % or more (upper limit of 100 mass %) of an alternating polymer is preferable. Moreover, it is preferable that the alternating polymer does not form a cross-linked product. Note that a cross-linked product is not formed due to $R^1$ of the monomer unit (A) including fluorine atoms.

The polymer undergoes main chain scission to lower molecular weight upon irradiation with ionizing radiation or the like (for example, an electron beam, KrF laser, ArF laser, or EUV laser) as a result of including the specific monomer units (A) and (B). Moreover, the polymer can sufficiently inhibit resist pattern collapse when used as a resist as a result of at least the monomer unit (A) including fluorine atoms.

Although the reason that resist pattern collapse can be inhibited through inclusion of a fluorine atom-containing monomer unit is not clear, it is presumed that as a result of liquid repellency of the polymer being enhanced, it is possible to inhibit pulling between patterns during removal of a developer or rinsing liquid in the resist pattern formation process.

—Monomer Unit (A)

The monomer unit (A) is a structural unit that is derived from a monomer (α) represented by general formula (III), shown below.

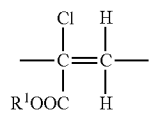
(III)

(In general formula (III), $R^1$ is the same as in general formula (I).)

The proportion constituted by the monomer unit (A) among all monomer units of the polymer is not specifically limited but can, for example, be set as not less than 30 mol % and not more than 70 mol %.

$R^1$ in general formula (I) and general formula (III) is required to be an organic group including 3 or more fluorine atoms from a viewpoint of improving main chain scission properties of the polymer upon irradiation with ionizing radiation or the like. On the other hand, $R^1$ in general formula (I) and general formula (III) is required to be an organic group including 7 or fewer fluorine atoms from a viewpoint of further improving the clarity of a resist pattern obtained when the polymer is used as a positive resist, with an organic group including 6 or fewer fluorine atoms being preferable.

The carbon number of $R^1$ is preferably not less than 2 and not more than 10, more preferably not less than 3 and not more than 4, and even more preferably 3. Solubility in a developer may not improve when the carbon number is too small, whereas the glass-transition point may be lowered and it may not be possible to ensure clarity of an obtained resist pattern when the carbon number is too large.

More specifically, $R^1$ in general formula (I) and general formula (III) is preferably a fluoroalkyl group, a fluoroalkoxyalkyl group, or a fluoroalkoxyalkenyl group, and is more preferably a fluoroalkyl group.

The fluoroalkyl group is, for example, a 2,2,2-trifluoroethyl group (number of fluorine atoms: 3; carbon number: 2), a 2,2,3,3,3-pentafluoropropyl group (number of fluorine atoms: 5; carbon number: 3; structural formula X shown below), a 3,3,4,4,4-pentafluorobutyl group (number of fluorine atoms: 5; carbon number: 4; structural formula Y shown below), a 1H-1-(trifluoromethyl)trifluoroethyl group (number of fluorine atoms: 6; carbon number: 3), a 1H,1H,3H-hexafluorobutyl group (number of fluorine atoms: 6; carbon number: 4), a 2,2,3,3,4,4,4-heptafluorobutyl group (number of fluorine atoms: 7; carbon number: 4), or a 1,2,2,2-tetrafluoro-1-(trifluoromethyl)ethyl group (number of fluorine atoms: 7; carbon number: 3), of which, a 2,2,3,3,3-pentafluoropropyl group (number of fluorine atoms: 5; carbon number: 3; structural formula X shown below) is preferable.

The fluoroalkoxyalkyl group is, for example, a fluoroethoxymethyl group or a fluoroethoxyethyl group.

The fluoroalkoxyalkenyl group is, for example, a fluoroethoxyvinyl group.

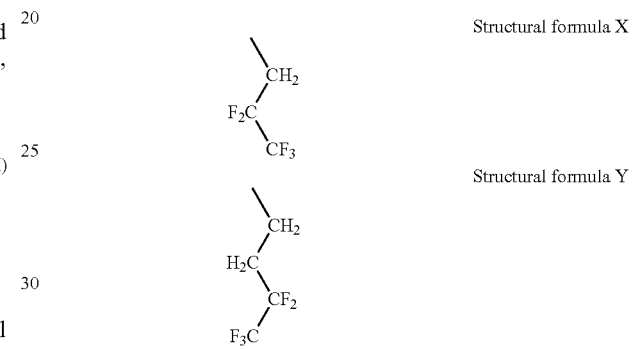

Examples of the monomer (a) represented by the previously described general formula (III) that can form the monomer unit (A) represented by the previously described general formula (I) include, but are not specifically limited to, fluoroalkyl esters of α-chloroacrylic acid such as 2,2,2-trifluoroethyl α-chloroacrylate, 2,2,3,3,3-pentafluoropropyl α-chloroacrylate, 3,3,4,4,4-pentafluorobutyl α-chloroacrylate, 1H-1-(trifluoromethyl)trifluoroethyl α-chloroacrylate, 1H,1H,3H-hexafluorobutyl α-chloroacrylate, 1,2,2,2-tetrafluoro-1-(trifluoromethyl)ethyl α-chloroacrylate, and 2,2,3,3,4,4,4-heptafluorobutyl α-chloroacrylate; fluoroalkoxyalkyl esters of α-chloroacrylic acid such as pentafluoroethoxymethyl α-chloroacrylate and pentafluoroethoxyethyl α-chloroacrylate; and fluoroalkoxyalkenyl esters of α-chloroacrylic acid such as pentafluoroethoxyvinyl α-chloroacrylate.

From a viewpoint of further improving main chain scission properties of the polymer upon irradiation with ionizing radiation or the like, the monomer unit (A) is preferably a structural unit that is derived from a fluoroalkyl ester of α-chloroacrylic acid. Furthermore, the monomer unit (A) is more preferably a structural unit that, from among fluoroalkyl esters of α-chloroacrylic acid, is derived from 2,2,3,3,3-pentafluoropropyl α-chloroacrylate. When the monomer unit (A) is a structural unit derived from 2,2,3,3,3-pentafluoropropyl α-chloroacrylate, it is possible to achieve particularly high sensitivity in the method of forming a resist pattern.

—Monomer Unit (B)

The monomer unit (B) is a structural unit that is derived from a monomer (b) represented by general formula (IV), shown below.

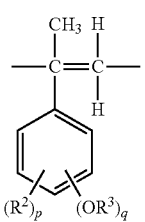

(IV)

(In general formula (IV), $R^2$, $R^3$, p, and q are the same as in general formula (II).)

The proportion constituted by the monomer unit (B) among all monomer units of the polymer is not specifically limited but can, for example, be set as not less than 30 mol % and not more than 70 mol %.

Examples of fluorine atom-substituted alkyl groups that can constitute $R^2$ or $R^3$ in general formula (II) and general formula (IV) include, but are not specifically limited to, groups having a structure in which all or some of the hydrogen atoms of an alkyl group are replaced by fluorine atoms.

Examples of unsubstituted alkyl groups that can constitute $R^2$ or $R^3$ in general formula (II) and general formula (IV) include, but are not specifically limited to, unsubstituted alkyl groups having a carbon number of not less than 1 and not more than 5. Of such alkyl groups, a methyl group or an ethyl group is preferable as an unsubstituted alkyl group that can constitute $R^2$ or $R^3$.

From a viewpoint of improving the ease of production of the polymer, the plurality of $R^2$ and/or $R^3$ groups that are present in general formula (II) and general formula (IV) are each preferably a hydrogen atom or an unsubstituted alkyl group, more preferably a hydrogen atom or an unsubstituted alkyl group having a carbon number of not less than 1 and not more than 5, and even more preferably a hydrogen atom.

Note that in general formula (II) and general formula (IV), from a viewpoint of improving the ease of production of the polymer, it is preferable that p is 5, q is 0, and the five $R^2$ groups are each a hydrogen atom or an unsubstituted alkyl group, more preferable that the five $R^2$ groups are each a hydrogen atom or an unsubstituted alkyl group having a carbon number of not less than 1 and not more than 5, and even more preferable that the five $R^2$ groups are each a hydrogen atom.

Moreover, from a viewpoint of increasing solubility in a developer and further increasing sensitivity in the method of forming a resist pattern, it is preferable that one fluorine is included in any one of the plurality of $R^2$ and $R^3$ groups present in general formula (II) and general formula (IV).

On the other hand, from a viewpoint of further inhibiting resist pattern collapse when the polymer is used in formation of a resist pattern, the plurality of $R^2$ and/or $R^3$ groups that are present in general formula (II) and general formula (IV) preferably include a fluorine atom or a fluorine atom-substituted alkyl group, and more preferably include a fluorine atom or a fluorine atom-substituted alkyl group having a carbon number of not less than 1 and not more than 5.

Examples of the monomer (b) represented by the previously described general formula (IV) that can form the monomer unit (B) represented by the previously described general formula (II) include, but are not specifically limited to, α-methylstyrene (AMS) and derivatives thereof (for example, 4-fluoro-α-methylstyrene (4FAMS) in accordance with general formula (b-2)) such as (b-1) to (b-11), shown below.

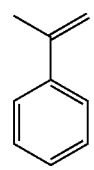

(b-1)

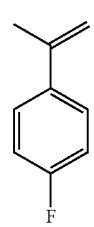

(b-2)

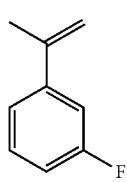

(b-3)

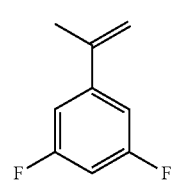

(b-4)

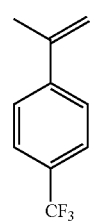

(b-5)

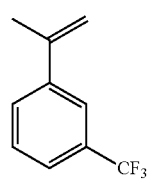

(b-6)

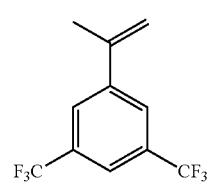

(b-7)

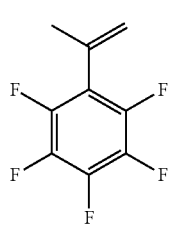

(b-8)

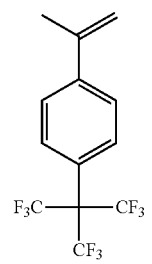

(b-9)

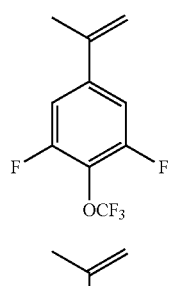

(b-10)

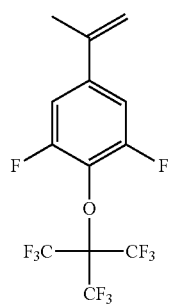

(b-11)

Note that from a viewpoint of improving the ease of production of the polymer, the monomer unit (B) preferably does not include a fluorine atom (i.e., preferably only the monomer unit (A) includes fluorine atoms), and is more preferably a structural unit derived from α-methylstyrene. In other words, it is particularly preferable that for $R^2$, $R^3$, p, and q in general formula (II) and general formula (IV), p=5, q=0, and all five $R^2$ groups are hydrogen atoms. Moreover, from a viewpoint of increasing solubility in a developer and further increasing sensitivity in the method of forming a resist pattern, it is preferable that the monomer unit (B) includes one fluorine. In other words, it is particularly preferable that for $R^2$, $R^3$, p, and q in general formula (II) and general formula (IV), p=5, q=0, and a fluorine atom is included in any one of the five $R^2$ groups.

—Weight-Average Molecular Weight

The weight-average molecular weight (Mw) of the polymer can be set as not less than 20,000 and not more than 150,000. Moreover, the weight-average molecular weight (Mw) of the polymer is preferably 100,000 or less, and more preferably 60,000 or less, and is preferably 30,000 or more. When the weight-average molecular weight of the polymer is not less than any of the lower limits set forth above, the elasticity of a positive resist formed using the polymer can be improved, and thus resist pattern collapse can be further inhibited. Moreover, when the weight-average molecular weight (Mw) of the polymer is not more than (less than) any of the upper limits set forth above, sensitivity in the method of forming a resist pattern using a resist composition that contains the polymer can be improved.

Note that "weight-average molecular weight (Mw)" referred to in the present disclosure can be measured by gel permeation chromatography.

—Number-Average Molecular Weight

The number-average molecular weight (Mn) of the polymer can be set as not less than 10,000 and not more than 100,000, for example. Moreover, the number-average molecular weight (Mn) of the polymer is preferably 80,000 or less, and more preferably 40,000 or less. When the number-average molecular weight (Mn) of the polymer is not more than (less than) any of the upper limits set forth above, sensitivity in the method of forming a resist pattern using a resist composition that contains the polymer can be improved to a suitable level.

Note that "number-average molecular weight (Mn)" referred to in the present disclosure can be measured by gel permeation chromatography in the same way as for the aforementioned "weight-average molecular weight (Mw)".

—Molecular Weight Distribution

The molecular weight distribution (Mw/Mn) of the polymer can be set as not less than 1.20 and not more than 2.50, for example. Moreover, the molecular weight distribution (Mw/Mn) of the polymer is preferably 1.25 or more, and is preferably 2.00 or less, and more preferably 1.40 or less. When the molecular weight distribution (Mw/Mn) of the polymer is not less than any of the lower limits set forth above, the ease of production of the polymer can be increased. When the molecular weight distribution (Mw/Mn) of the polymer is not more than any of the upper limits set forth above, the clarity of an obtained resist pattern can be further increased.

Note that "molecular weight distribution (Mw/Mn)" referred to in the present disclosure is the ratio of the weight-average molecular weight (Mw) relative to the number-average molecular weight (Mn).

—Surface Free Energy

The surface free energy of a resist film formed using the polymer is preferably 30 mJ/m$^2$ or less, and more preferably 25 mJ/m$^2$ or less, and is preferably 15 mJ/m$^2$ or more, and more preferably 20 mJ/m$^2$ or more. When the surface free energy is not more than any of the upper limits set forth above, a region that has been irradiated with ionizing radiation or light in the exposure step can be selectively dissolved. Moreover, when the surface free energy is not less than any of the lower limits set forth above, good rinsing by a rinsing liquid is possible.

Note that the surface free energy can be calculated by a method described in the EXAMPLES section of the present specification.

—Production Method of Polymer

The polymer including the monomer unit (A) and the monomer unit (B) set forth above can be produced, for example, by carrying out polymerization of a monomer composition that contains the monomer (a) and the monomer (b), and then optionally purifying the obtained polymerized product.

The composition, molecular weight distribution, weight-average molecular weight, and number-average molecular weight of the polymer can be adjusted by altering the polymerization conditions and the purification conditions. In one specific example, the composition of the polymer can be adjusted by altering the proportion in which each monomer is contained in the monomer composition used in polymerization. In another example, the weight-average molecular weight and the number-average molecular weight can be reduced by raising the polymerization temperature. In yet another example, the weight-average molecular weight and the number-average molecular weight can be reduced by shortening the polymerization time.

—Polymerization of Monomer Composition

The monomer composition used in production of the polymer may be a mixture containing a monomer component that includes the monomer (a) and the monomer (b), an optionally useable solvent, a polymerization initiator, and optionally added additives. Polymerization of the monomer composition may be carried out by a known method. In particular, in a case in which a solvent is used, it is preferable that cyclopentanone or the like is used as the solvent. Moreover, it is preferable that a radical polymerization initiator such as azobisisobutyronitrile is used as the polymerization initiator.

A polymerized product obtained through polymerization of the monomer composition may be used as the polymer as obtained or may, without any specific limitations, be collected by adding a good solvent such as tetrahydrofuran to a solution containing the polymerized product and subsequently dripping the solution to which the good solvent has been added into a poor solvent such as methanol to coagulate the polymerized product, and then the polymerized product may be purified as described below.

The method of purification in a case in which the obtained polymerized product is purified may be, but is not specifically limited to, a known purification method such as reprecipitation or column chromatography. Of these purification methods, purification by reprecipitation is preferable.

Note that purification of the polymerized product may be performed repeatedly.

Purification of the polymerized product by reprecipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to cause precipitation of a portion of the polymerized product. When purification of the polymerized product is carried out by dripping a solution of the polymerized product into a mixed solvent of a good solvent and a poor solvent as described above, the molecular weight distribution, weight-average molecular weight, and number-average molecular weight of the resultant polymer can easily be adjusted by altering the types and/or mixing ratio of the good solvent and the poor solvent. In one specific example, the molecular weight of polymer that precipitates in the mixed solvent can be increased by increasing the proportion of the good solvent in the mixed solvent.

Also note that in a situation in which the polymerized product is purified by reprecipitation, polymerized product that precipitates in the mixed solvent of the good solvent and the poor solvent may be used as the polymer in the presently disclosed method, or polymerized product that does not precipitate in the mixed solvent (i.e., polymerized product dissolved in the mixed solvent) may be used as the polymer in the presently disclosed method. Polymerized product that does not precipitate in the mixed solvent can be collected from the mixed solvent by a known technique such as concentration to dryness.

The solvent may be any known solvent in which the above-described polymer is soluble. Of such solvents, an n-pentyl ester of an organic acid, an n-hexyl ester of an organic acid, or a mixture thereof is preferable from a viewpoint of obtaining a positive resist composition having appropriate viscosity and improving coatability of the positive resist composition, with n-pentyl acetate, n-hexyl acetate, or a mixture thereof being more preferable, and n-hexyl acetate being even more preferable.

<Exposure Step>

In the exposure step, the resist film that has been formed in the film formation step is irradiated with ionizing radiation or light to write a desired pattern.

Irradiation with ionizing radiation or light can be carried out using a known writing device such as an electron beam writer or a laser writer.

<Development Step>

In the development step, the resist film that has been exposed in the exposure step and a developer are brought into contact to develop the resist film and form a resist pattern on the workpiece.

The method by which the resist film and the developer are brought into contact may be, but is not specifically limited to, a method using a known technique such as immersion of the resist film in the developer or application of the developer onto the resist film.

[Developer]

The developer used in the presently disclosed method of forming a resist pattern can, without any specific limitations, be any solvent that can dissolve a part of a resist film where main chain scission has occurred. Of such solvents, a solvent having a surface tension of 17.0 mN/m or less is preferably used as the developer. The surface tension of the developer is preferably 16.5 mN/m or less, and more preferably 15.0 mN/m or less. When the developer has a surface tension of 17.0 mN/m or less, the developer readily enters into fine gaps even when the development target is a fine resist pattern. Note that the surface tension of the developer can, for example, be 10.0 mN/m or more.

Moreover, it is preferable that a fluorine-containing solvent is used as the developer. The fluorine-containing solvent may, for example, be $CF_3CFHCFHCF_2CF_3$ (surface tension: 14.1 mN/m; SP value: 6.8 $(cal/cm^3)^{1/2}$), $CF_3CF_2CHCl_2$ (surface tension: 16.2 mN/m; SP value: 6.9 $(cal/cm^3)^{1/2}$), or $C_8F_{18}$ (surface tension: 13.6 mN/m). Although one of these solvents may be used individually or two or more of these solvents may be used as a mixture, it is preferable that one solvent is used individually as the developer from a viewpoint of ease of collection, re-use, etc. Note that although a liquid obtained by mixing a fluorine-containing solvent with another solvent may be used as the developer, from a viewpoint of increasing solubility of the resist film and further improving sensitivity in the method of forming a resist pattern, it is preferable that the developer contains 95 volume % or more of a fluorine-containing solvent, more preferable that the developer contains 99 volume % or more of a fluorine-containing solvent, and preferable that the developer is substantially composed of only a fluorine-containing solvent. The phrase "substantially composed of only a fluorine-containing solvent" is a concept that can be inclusive of both a case in which the proportion constituted by a fluorine-containing solvent in the developer is 100 volume % and a case in which the developer contains an additive or the like in a trace amount of less than 0.1 volume %, for example, but is mainly composed of a fluorine-containing solvent. Note that since fluorine-containing solvents generally have high volatility, when a fluorine-containing solvent has been used in a conventional technique, the fluorine-containing solvent has typically been removed through drying by blowing or the like to obtain a resist pattern, without performing rinsing of the resist film that has been developed by the developer.

Furthermore, the developer preferably has a solubility parameter (SP value) of more than 6.5 $(cal/cm^3)^{1/2}$ and not more than 10.0 $(cal/cm^3)^{1/2}$ from a viewpoint of increasing the solubility of a part of the resist film where main chain scission has occurred.

The temperature of the developer is not specifically limited and can be set as not lower than 21° C. and not higher than 25° C., for example. Moreover, the development time can be set as not less than 30 seconds and not more than 4 minutes, for example.

<Rinsing Step>

In the rinsing step, the resist film that has been developed in the development step and a rinsing liquid having a surface tension of 20.0 mN/m or less are brought into contact to rinse the developed resist film and form a resist pattern on the workpiece. In the presently disclosed method, resist residues that are attached to the developed resist film can be effectively removed as a result of a rinsing step being performed using a rinsing liquid having the specific property set forth above after the development step. Therefore, the presently disclosed method of forming a resist pattern makes it possible to effectively inhibit the presence of residues in an obtained resist pattern and to form a clear resist pattern.

The method by which the developed resist film and the rinsing liquid are brought into contact may be, but is not specifically limited to, a method using a known technique such as immersing the resist film in the rinsing liquid or applying the rinsing liquid onto the resist film.

[Rinsing Liquid]

The rinsing liquid used in the presently disclosed method of forming a resist pattern is required to have a surface tension of 20.0 mN/m or less. Moreover, from a viewpoint of even more effectively inhibiting the presence of residues in an obtained resist pattern, the surface tension of the rinsing liquid is preferably 18.0 mN/m or less, and more preferably 14.5 mN/m or less, and is preferably 10.0 mN/m or more, and more preferably 12.5 mN/m or more. Furthermore, from a viewpoint of even more effectively inhibiting resist pattern collapse and further improving the clarity of an obtained resist pattern, the rinsing liquid preferably comprises a fluorine-containing solvent that is different to a developer such as previously described.

The rinsing liquid preferably contains a compound that can be represented by general formula (α), shown below.

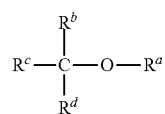

(α)

(In general formula (α), $R^a$ is an unsubstituted alkyl group, $R^b$ to $R^d$ are each a fluorine atom or a fluorine atom-substituted alkyl group, and at least one among $R^a$ to $R^d$ includes a fluorine atom.) Note that the compound represented by general formula (α) is a fluorine-containing compound, and a solvent that comprises this fluorine-containing compound is a fluorine-containing solvent.

Examples of unsubstituted alkyl groups that can constitute $R^a$ in general formula (α) include unsubstituted alkyl groups having a carbon number of not less than 1 and not more than 5, of which, a methyl group or an ethyl group is preferable.

Moreover, the fluorine atom-substituted alkyl group that can constitute any of $R^b$ to $R^d$ in general formula (α) is preferably a fluorine atom-substituted alkyl group having a carbon number of not less than 1 and not more than 5, and more preferably a 1,1,2,2,3,3,3-heptafluoropropyl group or a 1,1,2,2,2-pentafluoroethyl group.

Although the rinsing liquid can contain one compound represented by general formula (α) or can contain two or more compounds represented by general formula (α), it is preferable that the rinsing liquid contains only one compound represented by general formula (α) from a viewpoint of ease of collection and re-use of the rinsing liquid. Note that it is preferable that the rinsing liquid does not substantially contain any of the compounds previously described as the "developer" or any other solvent that can typically be used in a pattern formation method using a main chain scission-type positive resist composition in addition to a compound represented by general formula (α). The phrase "does not substantially contain" refers to an extremely low ratio relative to the overall rinsing liquid, such as less than 0.1 volume %.

In particular, preferable examples of compounds that can be represented by general formula (α) and can be contained in the rinsing liquid include methyl nonafluorobutyl ether (surface tension: 13.6 mN/m; SP value: 6.5 $(cal/cm^3)^{1/2}$; freezing point: −135°; boiling point: 61° C.) represented by general formula (α-1), shown below, ethyl nonafluorobutyl ether (surface tension: 13.6 mN/m; SP value: 6.3 $(cal/cm^3)^{1/2}$; freezing point: −138° C.; boiling point: 76° C.) represented by general formula (α-2), shown below, and 1,1,1,2,2,3,4,5,5,5-decafluoro-3-methoxy-4-(trifluoromethyl)pentane (surface tension: 15.0 mN/m; SP value: 6.2 $(cal/cm^3)^{1/2}$; freezing point (pour point): −38° C.; boiling point: 98° C.) represented by general formula (α-3), shown below, with methyl nonafluorobutyl ether represented by general formula (α-1) and ethyl nonafluorobutyl ether represented by general formula (α-2) being more preferable from a viewpoint of even more effectively inhibiting the presence of residues in an obtained resist pattern.

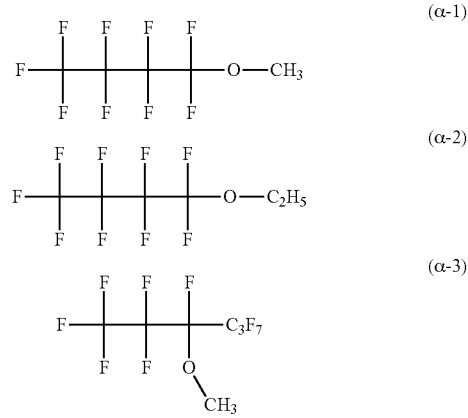

The solubility parameter (SP value) of the rinsing liquid is preferably 11.0 $(cal/cm^3)^{1/2}$ or less, more preferably less than 6.8 $(cal/cm^3)^{1/2}$, and even more preferably 6.5 $(cal/cm^3)^{1/2}$ or less from a viewpoint of even more effectively inhibiting the presence of residues in an obtained resist pattern. Note that the SP value of the rinsing liquid can, for example, be 2.0 (cal/cm$^3$)$^{1/2}$ or more. The freezing point of the rinsing liquid is preferably −30° C. or lower, and may be −100° C. or lower. The boiling point of the rinsing liquid is preferably 100° C. or lower, and more preferably 80° C. or lower. Note that the "freezing point" and the "boiling point" of the rinsing liquid are values at 1 atm.

The temperature of the rinsing liquid is not specifically limited and can be set as not lower than 21° C. and not higher than 25° C., for example. Moreover, the rinsing time can be set as not less than 5 seconds and not more than 3 minutes, for example.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure and evaluate the weight-average molecular weight, number-average molecular weight, and molecular weight distribution of a polymer, and the surface free energy, pattern collapse resistance, presence of residues, Eth, and γ value of a positive resist. Note that the SP value of each developer and each rinsing liquid was calculated by the group contribution method of Hoy. Moreover, the surface tension of each developer and each rinsing liquid was measured by the ring method at 25° C.

<Weight-Average Molecular Weight, Number-Average Molecular Weight, and Molecular Weight Distribution>

The weight-average molecular weight (Mw) and the number-average molecular weight (Mn) of a polymer obtained in each example or comparative example were measured by gel permeation chromatography, and then the molecular weight distribution (Mw/Mn) of the polymer was calculated. Specifically, the weight-average molecular weight (Mw) and the number-average molecular weight (Mn) of the polymer were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

<Surface Free Energy>

Under conditions described below, a goniometer (Drop Master 700 produced by Kyowa Interface Science Co., Ltd.) was used to measure the contact angle of two solvents (water and diiodomethane), for which surface tension, a polar component (p), and a dispersive force component (d) were known, with a resist film prepared by a method described below using a polymer obtained in each example or comparative example. Surface free energy was evaluated by the Owens-Wendt method (extended Fowkes model) to calculate the surface free energy of the resist film. The measurement conditions in contact angle measurement were as described below.

[Preparation of Resist Film]

A spin coater (MS-A150 produced by Mikasa Co., Ltd.) was used to apply a positive resist composition onto a silicon wafer of 4 inches in diameter such as to have a thickness of 500 nm. The applied positive resist composition was heated for 3 minutes by a hot-plate at a temperature of 180° C. to form a resist film on the silicon wafer.

[Measurement Conditions in Contact Angle Measurement]
Needle: Metal needle 22G (for water) and Teflon® (Teflon is a registered trademark in Japan, other countries, or both) coated needle 22G (for diiodomethane)
Wait time: 1,000 ms
Liquid volume: 1.8 μL
Liquid landing recognition: water 50 dat; diiodomethane 100 dat
Temperature: 23° C.

Example 1

<Production of Polymer>

A monomer composition containing 3.0 g of 2,2,2-trifluoroethyl α-chloroacrylate (ACATFE) as monomer (a), 4.398 g of α-methylstyrene (AMS) as monomer (b), 0.00698 g of azobisisobutyronitrile as a polymerization initiator, and 1.851 g of cyclopentanone as a solvent was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 50,883, a number-average molecular weight (Mn) of 31,303, and a molecular weight distribution (Mw/Mn) of 1.625. Moreover, the obtained polymerized product comprised 50 mol % of 2,2,2-trifluoroethyl α-chloroacrylate units and 50 mol % of α-methylstyrene units.

[Purification of Polymerized Product]

Next, 100 g of the obtained polymerized product was dissolved in THF, and the resultant solution was dripped into a mixed solvent of 150 g of THF and 850 g of methanol (MeOH) to cause precipitation of a white coagulated material (polymer comprising α-methylstyrene units and 2,2,2-trifluoroethyl α-chloroacrylate units). Thereafter, the solution containing the polymer that had precipitated was filtered using a Kiriyama funnel to obtain a white polymer. The weight-average molecular weight, number-average molecular weight, and molecular weight distribution of the obtained polymer were measured. The results are shown in Table 1.

<Production of Positive Resist Composition>

The obtained polymer was dissolved in isoamyl acetate as a solvent to produce a resist solution (positive resist composition) in which the concentration of the polymer was 2 mass %. The surface free energy, pattern collapse resistance, presence of residues, γ value, and Eth of a positive resist film formed of the polymer were evaluated as described below. The results are shown in Table 1.

<Pattern Collapse Resistance of Resist Film>

A spin coater (MS-A150 produced by Mikasa Co., Ltd.) was used to apply the positive resist composition onto a silicon wafer of 4 inches in diameter. Next, the applied positive resist composition was heated for 3 minutes by a hot-plate at a temperature of 180° C. to form a resist film of 40 nm in thickness on the silicon wafer. An electron beam writer (ELS-S50 produced by Elionix Inc.) was used to write a pattern through exposure of the resist film to an optimal exposure dose ($E_{op}$). Development treatment was subsequently carried out for 1 minute at a temperature of 23° C.

using a fluorine-containing solvent (produced by Du Pont-Mitsui Fluorochemicals Co., Ltd.; Vertrel XF® (Vertrel XF is a registered trademark in Japan, other countries, or both); $CF_3CFHCFHCF_2CF_3$) having a surface tension of 14.1 mN/m as a resist developer. Thereafter, 10 seconds of rinsing was performed using a fluorine-containing solvent (produced by 3M; Novec® 7100 (Novec is a registered trademark in Japan, other countries, or both); methyl nonafluorobutyl ether; freezing point: −135° C.; boiling point: 61° C.) having a surface tension of 13.6 mN/m as a rinsing liquid to form a resist pattern. The occurrence of pattern collapse of the formed resist pattern was inspected. Note that the optimal exposure dose ($E_{op}$) was set as appropriate with a value approximately double Eth measured as described below as a rough guide. Lines (non-exposed regions) and spaces (exposed regions) of the resist pattern were each set as 20 nm (i.e., a half pitch of 20 nm; hereinafter, also denoted as "hp 20 nm").

Pattern collapse resistance was evaluated in accordance with the following standard.

A: Pattern collapse not observed
B: Pattern collapse observed

<Presence of Residues>

The resist pattern formed in evaluation of "Pattern collapse resistance of resist film" described above was observed at ×100,000 magnification using a scanning electron microscope (SEM), and the degree to which residues were present in the resist pattern was evaluated in accordance with the following standard. Note that a residue present in the resist pattern can be recognized in an SEM image as a "dot" of high brightness compared to a line pattern region where a residue is not attached, for example.

A: Residues not observed in hp 20 nm resist pattern
B: Residues observed in hp 20 nm resist pattern in very small amount that is within permissible range
C: Residues observed in hp 20 nm resist pattern in large amount that is not in permissible range <γ Value of Resist Film>

A spin coater (MS-A150 produced by Mikasa Co., Ltd.) was used to apply the positive resist composition onto a silicon wafer of 4 inches in diameter such as to have a thickness of 500 nm. The applied positive resist composition was heated for 3 minutes by a hot-plate at a temperature of 180° C. to form a resist film on the silicon wafer. An electron beam writer (ELS-S50 produced by Elionix Inc.) was used to write a plurality of patterns (dimensions: 500 μm×500 μm) over the resist film with different electron beam irradiation doses, and development treatment was carried out for 1 minute at a temperature of 23° C. using a fluorine-containing solvent (produced by Du Pont-Mitsui Fluorochemicals Co., Ltd.; Vertrel XF®; $CF_3CFHCFHCF_2CF_3$) having a surface tension of 14.1 mN/m as a resist developer. Thereafter, 10 seconds of rinsing was performed using a fluorine-containing solvent (produced by 3M; Novec® 7100; methyl nonafluorobutyl ether; freezing point: −135° C.; boiling point: 61° C.) having a surface tension of 13.6 mN/m as a rinsing liquid.

The electron beam irradiation dose was varied in a range of 4 μC/cm² to 200 μC/cm² in increments of 4 μC/cm². Next, an optical film thickness meter (Lambda Ace VM-1200 produced by SCREEN Semiconductor Solutions Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/ thickness of resist film formed on silicon wafer). The γ value was calculated using the formula shown below with respect to the obtained sensitivity curve (horizontal axis: common logarithm of total electron beam irradiation dose; vertical axis: remaining film fraction of resist film (0≤remaining film fraction≤1.00)). In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, $E_1$ is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00.

$$\gamma = \left|\log_{10}\left(\frac{E_1}{E_0}\right)\right|^{-1}$$

A larger γ value indicates that the sensitivity curve has a larger gradient.

<Eth>

A resist film was formed on a silicon wafer in the same way as in the evaluation method for "γ Value of resist film". The initial thickness $T_0$ of the resultant resist film was measured using an optical film thickness meter (Lambda Ace VM-1200 produced by SCREEN Semiconductor Solutions Co., Ltd.). Moreover, the total electron beam irradiation dose Eth (μC/cm²) was determined for when the remaining film fraction was 0 on the straight line (linear approximation of sensitivity curve gradient) obtained in calculation of the γ value. A smaller value for Eth indicates higher resist film sensitivity and higher resist pattern formation efficiency.

Example 2

Various evaluations, etc., were performed in the same way as in Example 1 with the exception that the rinsing liquid used in the various evaluations, etc., was changed to "Novec® 7200" (produced by 3M; ethyl nonafluorobutyl ether; freezing point: −138° C.; boiling point: 76° C.), which is a fluorine-containing solvent having a surface tension of 13.6 mN/m. The results are shown in Table 1.

Example 3

Various evaluations, etc., were performed in the same way as in Example 1 with the exception that the rinsing liquid used in the various evaluations, etc., was changed to "Novec® 7300" (produced by 3M; 1,1,1,2,2,3,4,5,5,5-decafluoro-3-methoxy-4-(trifluoromethyl)pentane; freezing point (pour point): −38° C.; boiling point: 98° C.), which is a fluorine-containing solvent having a surface tension of 15.0 mN/m. The results are shown in Table 1.

Example 4

A positive resist composition was produced and various evaluations, etc., were performed in the same way as in Example 1 with the exception that a polymer produced as described below was used in production of the positive resist composition used in the various evaluations, etc. The results are shown in Table 1.

<Production of Polymer>

A monomer composition containing 3.0 g of 2,2,3,3,3-pentafluoropropyl α-chloroacrylate (ACAPFP) as monomer (a), 3.476 g of α-methylstyrene (AMS) as monomer (b), 0.00551 g of azobisisobutyronitrile as a polymerization initiator, and 1.620 g of cyclopentanone as a solvent was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 46,772, a number-average molecular weight (Mn) of 29,853, and a molecular weight distribution (Mw/Mn) of 1.567. Moreover, the obtained polymerized product comprised 50 mol % of 2,2,3,3,3-pentafluoropropyl α-chloroacrylate units and 50 mol % of α-methylstyrene units.

A polymer was then obtained in the same way as in Example 1 with the exception that in purification of the polymerized product, the resultant solution was dripped into a mixed solvent of 150 g of THF and 850 g of methanol (MeOH). The weight-average molecular weight, number-average molecular weight, and molecular weight distribution of the obtained polymer were measured in the same way as in Example 1. The results are shown in Table 1.

Examples 5 and 6

A polymer produced in the same way as in Example 4 was used in production of a positive resist composition used in various evaluations, etc. Moreover, the rinsing liquid used in the various evaluations, etc., was changed to Novec® 7200 in Example 5 and to Novec® 7300 in Example 6. With the exception of these points, a positive resist composition was produced and the various evaluations, etc., were performed in the same way as in Example 1. The results are shown in Table 1.

Example 7

A positive resist composition was produced and various evaluations, etc., were performed in the same way as in Example 1 with the exception that a polymer produced as described below was used in production of the positive resist composition used in the various evaluations, etc. The results are shown in Table 1.

<Production of Polymer>

A monomer composition containing 3.0 g of 2,2,3,3,3-pentafluoropropyl α-chloroacrylate (ACAPFP) as monomer (a), 3.235 g of 4-fluoro-α-methylstyrene (4FAMS) as monomer (b), and 0.00521 g of azobisisobutyronitrile as a polymerization initiator was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 38,837, a number-average molecular weight (Mn) of 22,658, and a molecular weight distribution (Mw/Mn) of 1.714. Moreover, the obtained polymerized product comprised 50 mol % of 2,2,3,3,3-pentafluoropropyl α-chloroacrylate units and 50 mol % of 4-fluoro-α-methylstyrene units.

A polymer was then obtained in the same way as in Example 1 with the exception that in purification of the polymerized product, the resultant solution was dripped into a mixed solvent of 50 g of THF and 950 g of methanol (MeOH). The weight-average molecular weight, number-average molecular weight, and molecular weight distribution of the obtained polymer were measured in the same way as in Example 1. The results are shown in Table 1.

Examples 8 and 9

A polymer produced in the same way as in Example 7 was used in production of a positive resist composition used in various evaluations, etc. Moreover, the rinsing liquid used in the various evaluations, etc., was changed to Novec® 7200 in Example 8 and to Novec® 7300 in Example 9. With the exception of these points, a positive resist composition was produced and the various evaluations, etc., were performed in the same way as in Example 1. The results are shown in Table 1.

Comparative Example 1

Operations were performed in the same manner as in Example 4 with the exception that, when carrying out various evaluations, a rinsing step was not performed. The results are shown in Table 2.

Comparative Example 2

Operations were performed in the same manner as in Example 4 with the exception that, when carrying out various evaluations, the rinsing liquid used in the rinsing step was changed to isopropyl alcohol (IPA). The results are shown in Table 2.

Comparative Example 3

Operations were performed in the same manner as in Example 4 with the exception that, when carrying out various evaluations, a rinsing step was not performed, and the developer used in the development step was changed to isopropyl alcohol (IPA). Note that it was not possible to develop a resist pattern because the formed resist film was insoluble in isopropyl alcohol (IPA) used as the developer. Therefore, none of the evaluations could be carried out.

Comparative Example 4

Operations were performed in the same manner as in Example 7 with the exception that, when carrying out various evaluations, a rinsing step was not performed. The results are shown in Table 2.

Comparative Example 5

Operations were performed in the same manner as in Example 7 with the exception that, when carrying out various evaluations, the rinsing liquid used in the rinsing step was changed to isopropyl alcohol (IPA). The results are shown in Table 2.

Comparative Example 6

Operations were performed in the same manner as in Example 7 with the exception that, when carrying out various evaluations, a rinsing step was not performed, and the developer used in the development step was changed to isopropyl alcohol (IPA). Note that it was not possible to develop a resist pattern because the formed resist film was insoluble in isopropyl alcohol (IPA) used as the developer. Therefore, none of the evaluations could be carried out.

Comparative Example 7

Operations were performed in the same manner as in Example 1 with the exception that, when carrying out various evaluations, a rinsing step was not performed. The results are shown in Table 2.

Comparative Example 8

Operations were performed in the same manner as in Example 1 with the exception that, when carrying out various evaluations, a rinsing step was not performed, and the developer used in the development step was changed to isopropyl alcohol (IPA). The results are shown in Table 2.

Note that in Tables 1 and 2:

"ACATFE" indicates 2,2,2-trifluoroethyl α-chloroacrylate;

"AMS" indicates α-methylstyrene;

"ACAPFP" indicates 2,2,3,3,3-pentafluoropropyl α-chloroacrylate;

"4FAMS" indicates 4-fluoro-α-methylstyrene; and

"Nov." indicates "Novec".

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Polymer | Monomer (a) | ACATFE | ACATFE | ACATFE | ACAPFP | ACAPFP | ACAPFP | ACAPFP | ACAPFP | ACAPFP |
| | Monomer (b) | AMS | AMS | AMS | AMS | AMS | AMS | 4FAMS | 4FAMS | 4FAMS |
| | Number of fluorine atoms [atoms] | 3 | 3 | 3 | 5 | 5 | 5 | 6 | 6 | 6 |
| | Number-average molecular weight (Mn) [—] | 46824 | 46824 | 46824 | 36136 | 36136 | 36136 | 36477 | 36477 | 36477 |
| | Weight-average molecular weight (Mw) [—] | 64383 | 64383 | 64383 | 49486 | 49486 | 49486 | 47603 | 47603 | 47603 |
| | Molecular weight distribution (Mw/Mn) [—] | 1.375 | 1.375 | 1.375 | 1.369 | 1.369 | 1.369 | 1.305 | 1.305 | 1.305 |
| | Surface free energy [mJ/m$^2$] | 29.8 | 29.8 | 29.8 | 24.2 | 24.2 | 24.2 | 22.2 | 22.2 | 22.2 |
| Developer | Type | Fluorine-containing | Fluorine-containing | Fluorine-containing | Fluorine-containing | Fluorine-containing | Fluorine-containing | Fluorine-containing | Fluorine-containing | Fluorine-containing |
| | Surface tension [mN/m] | 14.1 | 14.1 | 14.1 | 14.1 | 14.1 | 14.1 | 14.1 | 14.1 | 14.1 |
| | SP value [(cal/cm$^3$)$^{1/2}$] | 6.8 | 6.8 | 6.8 | 6.8 | 6.8 | 6.8 | 6.8 | 6.8 | 6.8 |
| Rinsing liquid | Type | Fluorine-containing Nov. 7100 | Fluorine-containing Nov. 7200 | Fluorine-containing Nov. 7300 | Fluorine-containing Nov. 7100 | Fluorine-containing Nov. 7200 | Fluorine-containing Nov. 7300 | Fluorine-containing Nov. 7100 | Fluorine-containing Nov. 7200 | Fluorine-containing Nov. 7300 |
| | Surface tension [mN/m] | 13.6 | 13.6 | 15.0 | 13.6 | 13.6 | 15.0 | 13.6 | 13.6 | 15.0 |
| | SP value [(cal/cm$^3$)$^{1/2}$] | 6.5 | 6.3 | 6.2 | 6.5 | 6.3 | 6.2 | 6.5 | 6.3 | 6.2 |
| Evaluation | Pattern collapse resistance | A | A | A | A | A | A | A | A | A |
| | Presence of residues | A | A | B | A | A | B | A | A | B |
| | Eth [μC/cm$^2$] | 273.04 | 273.21 | 273.34 | 85.003 | 84.977 | 85.714 | 76.810 | 77.039 | 76.486 |
| | γ Value [—] | 54.12 | 53.99 | 53.21 | 30.316 | 30.832 | 28.692 | 32.196 | 29.621 | 26.210 |

TABLE 2

| | | Comparative Example 1 | Comparative Example 2 | Comparative Example 3 | Comparative Example 4 | Comparative Example 5 |
|---|---|---|---|---|---|---|
| Polymer | Monomer (a) | ACAPFP | ACAPFP | ACAPFP | ACAPFP | ACAPFP |
| | Monomer (b) | AMS | AMS | AMS | 4FAMS | 4FAMS |
| | Number of fluorine atoms [atoms] | 5 | 5 | 5 | 6 | 6 |
| | Number-average molecular weight (Mn) [—] | 36136 | 36136 | 36136 | 36477 | 36477 |
| | Weight-average molecular weight (Mw) [—] | 49486 | 49486 | 49486 | 47603 | 47603 |
| | Molecular weight distribution (Mw/Mn) [—] | 1.369 | 1.369 | 1.369 | 1.305 | 1.305 |
| | Surface free energy [mJ/m$^2$] | 24.2 | 24.2 | 24.2 | 22.2 | 22.2 |

TABLE 2-continued

| Developer | Type | Fluorine-containing | Fluorine-containing | IPA | Fluorine-containing | Fluorine-containing |
|---|---|---|---|---|---|---|
| | Surface tension [mN/m] | 14.1 | 14.1 | 20.8 | 14.1 | 14.1 |
| | SP value [(cal/cm$^3$)$^{1/2}$] | 6.8 | 6.8 | 11.4 | 6.8 | 6.8 |
| Rinsing liquid | Type | No rinse | IPA | No rinse | No rinse | IPA |
| | Surface tension [mN/m] | | 20.8 | | | 20.8 |
| | SP value [(cal/cm$^3$)$^{1/2}$] | | 11.4 | | | 11.4 |
| Evaluation | Pattern collapse resistance | A | C | Not developable | A | C |
| | Presence of residues | C | B | | C | B |
| | Eth [µC/cm$^2$] | 84.879 | 81.374 | | 76.872 | 73.434 |
| | γ Value [—] | 22.293 | 18.213 | | 20.083 | 16.970 |

| | | | Comparative Example 6 | Comparative Example 7 | Comparative Example 8 |
|---|---|---|---|---|---|
| Polymer | Monomer (a) | | ACAPFP | ACATFE | ACATFE |
| | Monomer (b) | | 4FAMS | AMS | AMS |
| | Number of fluorine atoms [atoms] | | 6 | 3 | 3 |
| | Number-average molecular weight (Mn) [—] | | 36477 | 46824 | 46824 |
| | Weight-average molecular weight (Mw) [—] | | 47603 | 64383 | 64383 |
| | Molecular weight distribution (Mw/Mn) [—] | | 1.305 | 1.375 | 1.375 |
| | Surface free energy [mJ/m$^2$] | | 22.2 | 29.8 | 29.8 |
| Developer | Type | | IPA | Fluorine-containing | IPA |
| | Surface tension [mN/m] | | 20.8 | 14.1 | 20.8 |
| | SP value [(cal/cm$^3$)$^{1/2}$] | | 11.4 | 6.8 | 11.4 |
| Rinsing liquid | Type | | No rinse | No rinse | No rinse |
| | Surface tension [mN/m] | | | | |
| | SP value [(cal/cm$^3$)$^{1/2}$] | | | | |
| Evaluation | Pattern collapse resistance | | Not developable | A | C |
| | Presence of residues | | | C | C |
| | Eth [µC/cm$^2$] | | | 274.04 | 195.33 |
| | γ Value [—] | | | 52.16 | 42.22 |

It can be seen from Table 1 that it was possible to effectively inhibit the occurrence of collapse and the presence of residues in a resist pattern in each of Examples 1 to 9 in which a resist film formed using a positive resist composition that contained a specific polymer was rinsed using a rinsing liquid having a surface tension of 20.0 mN/m or less.

On the other hand, Comparative Examples 1 to 8 in Table 2 demonstrate that it was not possible to effectively inhibit both the occurrence of collapse and the presence of residues in a resist pattern in a case in which rinsing was not performed or was performed using a rinsing liquid having a surface tension of more than 20.0 mN/m.

INDUSTRIAL APPLICABILITY

Through the presently disclosed method of forming a resist pattern, the occurrence of collapse and the presence of residues in a resist pattern can be effectively inhibited.

The invention claimed is:

1. A method of forming a resist pattern comprising:
forming a resist film using a positive resist composition containing a solvent and a polymer including a monomer unit (A) represented by general formula (I), shown below,

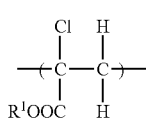

where, in general formula (I), R$^1$ is an organic group including not fewer than 3 and not more than 7 fluorine atoms, and a monomer unit (B) represented by general formula (II), shown below,

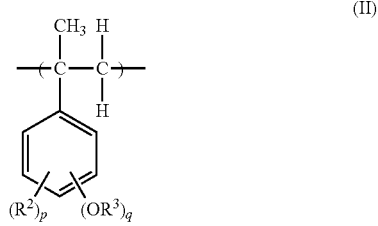

where, in general formula (II), R$^2$ is a hydrogen atom, a fluorine atom, an unsubstituted alkyl group, or a fluorine atom-substituted alkyl group, R$^3$ is a hydrogen atom, an unsubstituted alkyl group, or a fluorine atom-substituted alkyl group, p and q are each an integer of not less than 0 and not more than 5, and p+q=5;
exposing the resist film;
developing the resist film that has been exposed; and
rinsing the resist film that has been developed, wherein the rinsing is performed using a rinsing liquid having a surface tension of 20.0 mN/m or less.

2. The method of forming a resist pattern according to claim 1, wherein a total number of fluorine atoms included in the monomer unit (A) and the monomer unit (B) is 5 or 6.

3. The method of forming a resist pattern according to claim 1, wherein the rinsing liquid has a solubility parameter of less than 6.8 (cal/cm$^3$)$^{1/2}$.

4. The method of forming a resist pattern according to claim 1, wherein the developing is performed using a developer having a surface tension of 17.0 mN/m or less.

5. The method of forming a resist pattern according to claim 4, wherein the developer and the rinsing liquid each comprise a different fluorine-containing solvent relative to one another.

* * * * *